(12) United States Patent
Zuopeng et al.

(10) Patent No.: US 12,218,004 B2
(45) Date of Patent: Feb. 4, 2025

(54) METHOD FOR FORMING SEMICONDUCTOR STRUCTURE

(71) Applicants: Semiconductor Manufacturing International (Shanghai) Corporation, Shanghai (CN); Semiconductor Manufacturing International (Beijing) Corporation, Beijing (CN)

(72) Inventors: He Zuopeng, Shanghai (CN); Yang Ming, Shanghai (CN); Bei Duohui, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 318 days.

(21) Appl. No.: 17/229,255

(22) Filed: Apr. 13, 2021

(65) Prior Publication Data

US 2022/0102205 A1  Mar. 31, 2022

(30) Foreign Application Priority Data

Sep. 30, 2020 (CN) .......................... 202011061150.5

(51) Int. Cl.
*H01L 21/76* (2006.01)
*H01L 21/033* (2006.01)
*H01L 21/768* (2006.01)

(52) U.S. Cl.
CPC .... *H01L 21/76832* (2013.01); *H01L 21/0338* (2013.01); *H01L 21/7684* (2013.01); *H01L 21/76877* (2013.01)

(58) Field of Classification Search
None
See application file for complete search history.

(56) References Cited

U.S. PATENT DOCUMENTS

2006/0043518 A1* 3/2006 Nakaji .............. H01L 31/02327
257/458
2015/0263061 A1* 9/2015 Karim .............. H01L 27/14685
257/53

(Continued)

*Primary Examiner* — Bradley Smith
(74) *Attorney, Agent, or Firm* — Crowell & Moring LLP

(57) ABSTRACT

A method for forming a semiconductor structure is provided. In one form, a method includes: providing a base; forming a pattern memory layer on the base, where at least a first trench and a second trench are provided on the pattern memory layer, where an extending direction of the first trench is parallel to an extending direction of the second trench, and the first trench and the second trench are formed using different masks; and forming mandrel lines separated on the base at positions of the base that correspond to the first trench and the second trench. By using the method, a problem that a photoresist peels off during etching due to an elongated shape when separated mandrel lines are directly formed can be avoided. Further, a problem of a relatively high requirement on a filling material when the mandrel lines are formed directly by using a plurality of photolithography processes can be avoided, to lower the requirement on the filling material.

4 Claims, 7 Drawing Sheets

(56) References Cited

U.S. PATENT DOCUMENTS

2017/0294545 A1* 10/2017 Zou .................. H01L 31/02363
2023/0078443 A1* 3/2023 Wu .................. H01L 21/32139
438/669

* cited by examiner

METHOD FOR FORMING SEMICONDUCTOR STRUCTURE

RELATED APPLICATIONS

The present application claims priority to Chinese Patent Appln. No. 202011061150.5, filed Sep. 30, 2020, the entire disclosure of which is hereby incorporated by reference.

BACKGROUND

Technical Field

Embodiments of the present disclosure relate to the field of semiconductor manufacturing, and in particular, to a method for forming a semiconductor structure.

Related Art

As semiconductor manufacturing technologies become increasingly sophisticated, integrated circuits (ICs) are undergoing significant changes. A quantity of components integrated on the same chip has increased from an initial tens or hundreds components to millions of components. To meet the requirement on circuit density, a batch processing technology is used in a manufacturing process of a semiconductor IC chip to form different types of complex devices on a substrate, and interconnect the devices using an interconnect structure, to implement a complete electronic function of the chip. Currently, in most cases, an ultra-low-k interlayer dielectric layer is used as a dielectric material for isolating metal connection lines inside. The interconnect structure is used for providing wiring between the devices on the IC chip and the entire package. In this technology, a device such as a field effect transistor (FET) is first formed on a surface of a semiconductor substrate, and then an interconnect structure is formed in a back end of line (BEOL) process of IC manufacturing.

As predicted by Moore's Law, with a dimension of semiconductor substrates continuously shrinking, it is inevitable to use an interconnect structure to connect transistors to form an increasing quantity of transistors on the semiconductor substrate, to improve the device performance. However, with the miniaturization and higher integration of components, a quantity of conductor connection lines in a circuit continuously increases. The formation quality of an interconnect structure significantly affects the performance of a BEOL circuit, or even affects normal operation of a semiconductor device.

Therefore, how to improve a formation quality of a smaller-dimension interconnect structure in the BEOL process has become a technical problem to be resolved urgently by a person skilled in the art.

SUMMARY

To address the foregoing problem, forms of the present disclosure provide a method for forming a semiconductor structure, to improve the formation quality of a smaller-dimension interconnect structure in a BEOL process.

To address the foregoing problem, forms of the present disclosure provide a method for forming a semiconductor structure. In one form, a method includes:
 providing a base;
 forming a pattern memory layer on the base, where at least a first trench and a second trench are provided on the pattern memory layer, an extending direction of the first trench is parallel to an extending direction of the second trench, and the first trench and the second trench are formed by using different masks; and
 forming mandrel lines separated on the base at positions of the base that correspond to the first trench and the second trench.

Compared to the related art, the technical solutions of the embodiments of the present disclosure have the following advantages.

In some implementations, the pattern memory layer is first formed on the base, where the first trench and the second trench that extend in directions parallel to each other are formed on the pattern memory layer using different masks. Then the mandrel lines separated on the base are formed at the positions of the base that correspond to the first trench and the second trench.

In some implementations, the trenches are first formed, and then the separated mandrel lines are formed at the positions corresponding to the first trench and the second trench. Further, a pattern of a photoresist used for forming the trenches is also a trench, and an area of a contact surface between the photoresist and the pattern memory layer is relatively large, which is different from directly forming the mandrel lines separated on the base, where the pattern of the photoresist is also a bulge having the same shape as the mandrel lines, and the area of the contact surface between the photoresist and the pattern memory layer is relatively small.

Accordingly, a problem can be avoided that the photoresist peels off during etching due to an elongated shape when the mandrel lines separated on the base are formed through etching by directly using the photoresist as a mask in a process of forming a small-dimension pattern. Further, the first trench and the second trench are formed successively using two photolithography processes using different masks, and the subsequently formed separated mandrel lines are formed using the same material, which can simplify steps of forming the mandrel lines for the first time using the first etching process and then performing material filling and performing the second photolithography process when the mandrel lines are formed directly using a plurality of photolithography processes, and lower a requirement on the filled material.

DETAILED DESCRIPTION

Figure 1:
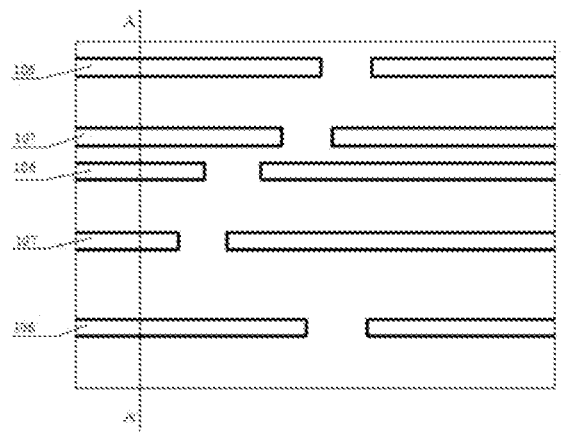
FIG. 1 to FIG. 21 are schematic structural diagrams corresponding to steps in one form of a method for forming a semiconductor structure according to the present disclosure.

It can be seen from the related art that with the miniaturization and higher integration of components, a quantity of conductor connection lines in a circuit continuously increases.

Because of the increasing quantity of conductor connection lines in the circuit, a pattern dimension of a metal interconnect line needs to be smaller, and a width of a pattern line of the IC needs to be smaller, leading to a higher requirement on a photolithography process. When an existing photolithography technology cannot meet a corresponding process requirement, a series of problems are likely to occur. For example, when at least two illuminations need to be performed to form a mandrel line, in a usual method, a first mandrel line is first formed through one photolithography process, and then material filling is performed around the first mandrel line to form a plane for a next illumination. An etch selectivity of a material filled around the first mandrel line to a material forming the first mandrel line is required to be relatively large, to avoid that the first mandrel line is damaged when a second mandrel line is formed through the second photolithography process. Similarly, when the third illumination needs to be performed, the second time of material filling is performed between the first mandrel line and the second mandrel line. Etch selectivities of a material filled the second time to the materials of the first mandrel line and the second mandrel line are relatively large, to avoid that the first mandrel line and the second mandrel line are damaged when a third mandrel line is formed through the third photolithography process. It can be seen that when the mandrel line is formed through a plurality of illuminations using the foregoing method, an elongated photoresist is likely to peel off during etching, which causes an unstable dimension of the finally formed mandrel line. In addition, materials with different selectivities need to be filled at different times, which leads to a higher requirement on material selection, and a troublesome process.

To address the foregoing technical problems, forms of the present disclosure provide a method for forming a semiconductor structure. One form of a method includes: providing a base; forming a pattern memory layer on the base, where a first trench and a second trench are provided on the pattern memory layer, an extending direction of the first trench is parallel to an extending direction of the second trench, and the first trench and the second trench are formed using different masks; and forming mandrel lines separated on the base at positions of the base that correspond to the first trench and the second trench.

In forms of a method for forming a semiconductor structure according to the present disclosure, the trenches are first formed, and then the separated mandrel lines are formed at the positions corresponding to the first trench and the second trench. In this implementation, a pattern of a photoresist used for forming the trenches is also a trench, and an area of a contact surface between the photoresist and the pattern memory layer is relatively large, which is different from directly forming the mandrel lines separated on the base, where the pattern of the photoresist is also a bulge having the same shape as the mandrel lines, and the area of the contact surface between the photoresist and the pattern memory layer is relatively small. Therefore, a problem that the photoresist peels off during etching due to an elongated shape when the mandrel lines separated on the base are formed through etching by directly using the photoresist as a mask in a process of forming a small-dimension pattern can be avoided. Further, the first trench and the second trench are formed successively using two photolithography processes, and the subsequently formed separated mandrel lines are formed using the same material, which can simplify steps of forming the mandrel lines for the first time using the first etching process and then performing material filling and performing the second photolithography process when the mandrel lines are formed directly by using a plurality of photolithography processes, and lower a requirement on the filled material.

To make the foregoing objectives, features, and advantages of the forms of the present disclosure more apparent and easier to understand, specific embodiments and implementations of the present disclosure are described in detail below with reference to the accompanying drawings.

FIG. 1 to FIG. 21 are schematic structural diagrams corresponding to steps in one form of the method for forming a semiconductor structure according to the present disclosure.

Figure 2:
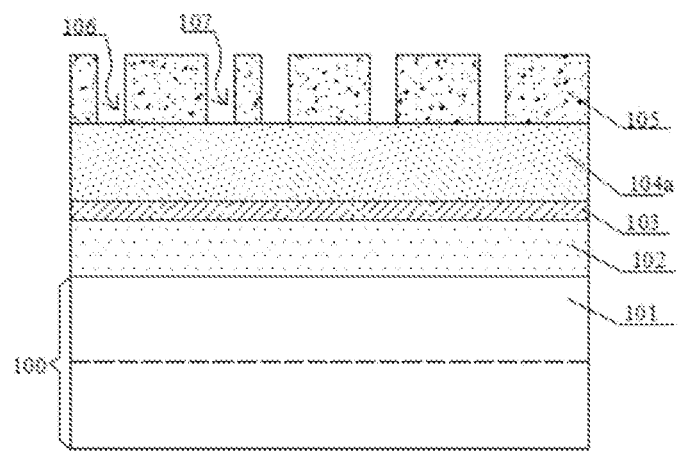

FIG. 1 is a top view of a semiconductor structure. FIG. 2 is a cross-sectional view obtained through cutting along a direction of a line AA' in FIG. 1. As shown in the figure, a base 100 is provided.

The base 100 is used for providing a process platform for a manufacturing process. A semiconductor device such as a transistor or a capacitor may be formed in the base 100. A functional structure such as a resistance structure or a conductive structure may also be formed in the base.

The base 100 includes a metal interconnect layer (not shown in the figure). After a metal layer is subsequently formed, the metal interconnect layer is used for electrically connecting to the metal layer in a BEOL process, to electrically connect the semiconductor device (for example, the transistor) or the functional structure to an external circuit or another interconnect structure.

The base further includes a dielectric layer 101. The dielectric layer 101 covers the metal interconnect layer.

The dielectric layer 101 is used for electrically isolating adjacent interconnect lines of the metal layer in the BEOL process.

Still referring to FIG. 1 and FIG. 2, a pattern memory layer 105 is formed on the base 100. At least a first trench 106 and a second trench 107 are provided on the pattern memory layer 105. An extending direction of the first trench 106 is parallel to an extending direction of the second trench 107. The first trench 106 and the second trench 107 are formed by using different masks.

One will appreciate that with the higher integration of semiconductor devices, a quantity of metal connection lines in a circuit continuously increases. As a result, a width of pattern lines of the metal connection lines becomes increasingly small. As limited by a process, a plurality of patterns cannot be formed using the same mask. To ensure the quality of the patterns, and avoid that a plurality of adjacent patterns is connected to each other after exposed at the same time, the first trench 106 and the second trench 107 are formed using different masks. That is, the two trenches are formed using two photolithography and etching processes. In this form, the first trench 106 is formed using the first photolithography and etching process. The second trench 107 is formed using the second photolithography and etching process. Certainly, in other forms, the third illumination may be further added to form another trench parallel to the first trench and the second trench. In this form, description is made using an example in which the first trench and the second trench are formed respectively through two photolithography processes.

The pattern memory layer 105 is used for providing a support platform for two masks, to finally transfer patterns of the two masks to the pattern memory layer 105.

In this form, a material of the pattern memory layer 105 is silicon oxide, which is a material commonly used in processes and costing less, and has relatively high process compatibility. In other forms, a material of the pattern memory layer may be one or a combination of at least two of silicon nitride or silicon oxynitride.

Specifically, the step of forming the pattern memory layer 105 includes: forming a pattern memory material layer (not shown) on the base 100; forming a patterned first photoresist layer (not shown) on the pattern memory material layer; etching the pattern memory material layer using the first photoresist layer as a mask, to form the first trench 106;

forming a patterned second photoresist layer (not shown) on the pattern memory material layer; and etching the pattern memory material layer using the second photoresist layer as a mask, to form the second trench 107.

In this form, before the second photoresist layer is formed, a second anti-reflective material layer filling the first trench 106 and covering the pattern memory material layer is formed first. The second anti-reflective material layer and a pattern memory material layer 104a below the second anti-reflective material layer are etched using the second photoresist layer as a mask, to form the second trench 107.

Then, mandrel lines 104 (shown in FIG. 8) separated on the base are formed at positions of the base 100 that correspond to the first trench and the second trench.

It should be noted that the mandrel lines 104 being formed at the positions corresponding to the first trench and the second trench means that the mandrel lines may be located at the positions of the first trench and the second trench, or may be located at positions that are on a film layer below the first trench and the second trench and correspond to the first trench and the second trench.

In some implementations, when the mandrel lines are located at the positions of the first trench and the second trench, the step of forming mandrel lines separated on the base includes: forming a mandrel material layer, where the mandrel material layer fills the first trench and the second trench, and covers the pattern memory layer; flattening the mandrel material layer, to form mandrel lines, where top surfaces of the mandrel lines are flush with a top surface of the pattern memory layer; and removing the pattern memory layer, to form the mandrel lines separated on the base.

However, in a practical process, as limited by the process, if a distance between two adjacent first trenches is excessively short in an extending direction of the first trench, the two first trenches cannot be formed directly by using the photolithography process. Similarly, if a distance between two adjacent second trenches is excessively short in an extending direction of the second trench, the two second trenches cannot be formed directly using the photolithography process. Therefore, to achieve a smaller dimension of the first trench or the second trench in the extending direction thereof, in some implementations of the present disclosure, after the forming mandrel lines, before the removing the pattern memory layer, the method further includes: etching the mandrel lines, to form mandrel line isolation openings; and the removing the pattern memory layer, to form mandrel lines separated on the base is removing the pattern memory layer, to form the mandrel lines that are separated on the base and have the mandrel line isolation openings.

In this way, after the mandrel lines are formed corresponding to the first trench and the second trench, the mandrel lines may be cut, to form patterns meeting a process requirement.

After the mandrel lines separated on the base are formed, because the mandrel lines correspond to the first trench and the second trench, projected patterns of the mandrel lines on the underlying base are patterns to be formed finally on the base. Therefore, after the patterns of the mandrel lines are transferred subsequently, the mandrel lines also need to be removed.

Therefore, the mandrel lines 104 need to be formed using a material that can be easily removed. The material of the mandrel lines 104 may be one or a combination of at least two of polycrystalline silicon, amorphous carbon, a photoresist, an organic dielectric layer material, or a dielectric anti-reflective coating material.

It should be noted that when the mandrel lines fill the first trench and the second trench, to ensure the formation quality of the mandrel lines in the filling process, the mandrel lines are formed using an atomic layer deposition (ALD) process. When the mandrel lines are formed using a material that can be easily removed, the mandrel lines are usually formed in the first trench and the second trench in a manner of coating. However, if dimensions of the first trench and the second trench are relatively small, the formation quality of the mandrel lines in the manner of coating may be poor.

To improve the formation quality of the mandrel lines, in some implementations, the formed mandrel lines may be located at positions that are on a film layer below the first trench and the second trench and correspond to the first trench and the second trench.

Specifically, referring to FIG. 3 to FIG. 8, when the mandrel lines 104 (shown in FIG. 8) are located on a film layer below the first trench and the second trench, a mandrel material layer 104a is formed on the base. The pattern memory layer 105 is formed on the mandrel material layer 104a. That is, before the pattern memory layer 105 is formed, the mandrel material layer 104a is formed on the base; and then the pattern memory layer 105 is formed on the mandrel material layer 104a.

The step of forming mandrel lines separated on the base includes: forming a sacrificial layer 108 filling the first trench and the second trench; removing the pattern memory layer 105; and etching the mandrel material layer 104a by using the sacrificial layer 108 as a mask, to form the mandrel lines 104.

The sacrificial layer 108 is used as an etching mask to etch the mandrel material layer 104a.

Figure 3:
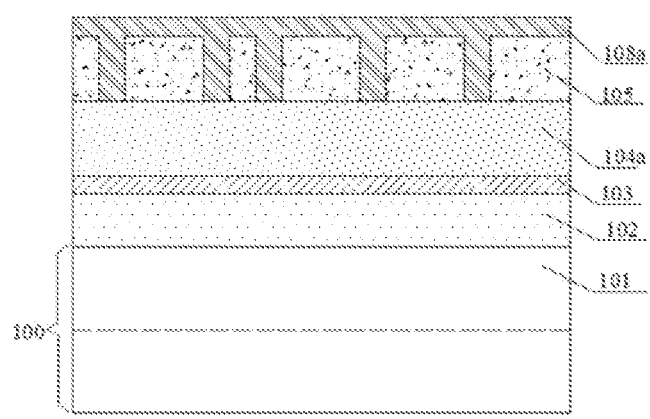
Figure 4:
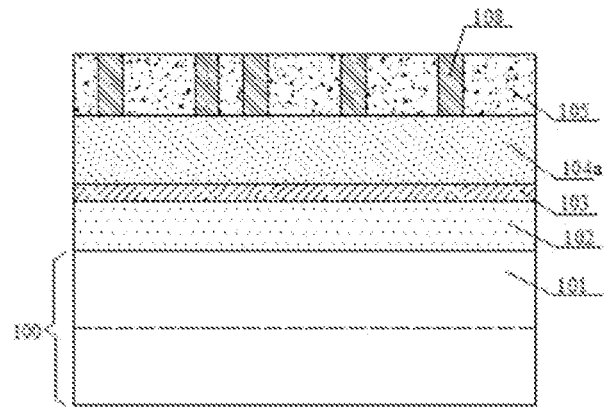

In this form, a material of the sacrificial layer 108 is silicon nitride. In other forms, the material of the sacrificial layer may be one or more of silicon oxynitride, silicon carbonitride, and silicon carbon boron nitride. Referring to FIG. 3 and FIG. 4, the step of forming a sacrificial layer 108 includes:

forming a sacrificial material layer 108a filling the first trench and the second trench, where the sacrificial material layer 108a covers the pattern memory layer 105; and flattening the sacrificial material layer 108a, to form the sacrificial layer 108, where the sacrificial layer 108 exposes the pattern memory layer 105.

When the sacrificial material layer 108a is flattened, the pattern memory layer 105 is used as an etch stop layer, and the rest of the sacrificial material layer is used as the sacrificial layer 108.

It should be noted that for ease of description, the present disclosure is described below using an example in which the mandrel lines are located on a film layer below the first trench and the second trench.

Figure 5:
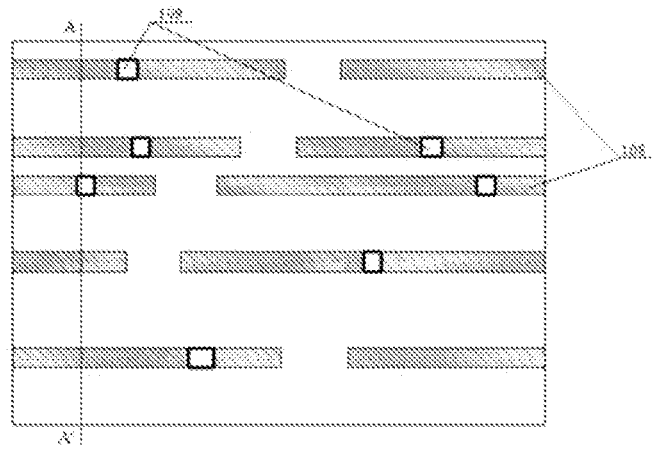
Figure 6:
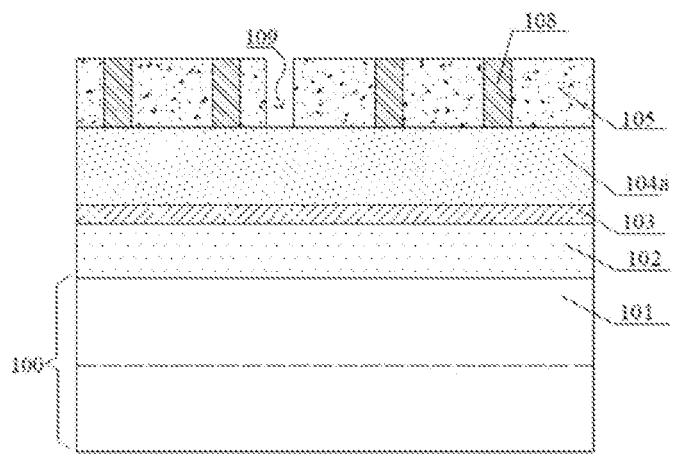

Referring to FIG. 5 to FIG. 6, after the forming a sacrificial layer 108, before removing the pattern memory layer 105, to form a smaller-dimension pattern meeting a process requirement, implementations of the method for forming a semiconductor structure according to present disclosure further includes: etching the sacrificial layer 108, to form a sacrificial layer isolation opening 109. FIG. 5 is a top view. FIG. 6 is a cross-sectional view along a direction of a line AA' in FIG. 5.

It is easy to understand that for a specific reason to achieve a smaller dimension of the first trench or the second trench in the extending direction thereof, reference is made to the foregoing description of forming the mandrel line isolation openings. Details are not described herein again. In this form of the present disclosure, after the forming a sacrificial layer 108, before the removing the pattern memory layer 105, the method further includes: etching the sacrificial layer 108, to form a sacrificial layer isolation opening 109. Then, the step of etching the mandrel material layer by using the sacrificial layer as a mask, to form the mandrel lines separated on the base includes: etching the mandrel material layer by using the sacrificial layer on which the sacrificial layer isolation opening is formed as a mask, to form the mandrel lines separated on the base.

In this way, after the sacrificial layer is formed corresponding to the first trench and the second trench, the sacrificial layer may be cut, to form patterns meeting a process requirement.

It should be noted that in an extending direction of the sacrificial layer 108, the continuously extending sacrificial layer is cut off by using the sacrificial layer isolation opening 109 (shown in FIG. 5), to divide the complete sacrificial layer 108 into a plurality of sacrificial layers having different lengths, so that a dimension of the sacrificial layer is shortened in the extending direction of the sacrificial layer, to meet a requirement on a process dimension.

In this form, formed sacrificial layer isolation openings 109 cut sacrificial layers filled in both the first trench and the second trench in one process step, to simplify the processing process.

Specifically, the step of patterning the sacrificial layer (etching the sacrificial layer, to form a sacrificial layer isolation opening) includes:

forming a shielding layer (not shown in the figure) on the sacrificial layer, where the shielding layer exposes a part of the sacrificial layer; and etching the sacrificial layer by using the shielding layer as a mask, to form the sacrificial layer isolation opening 109 (shown in FIG. 5).

It should be noted that the shielding layer exposing a part of the sacrificial layer means that the shielding layer exposes the sacrificial layer at a position where the sacrificial layer isolation opening 109 is formed in FIG. 5. The shielding layer is used for shielding a sacrificial layer region that does not need to be etched, to ensure that the formed sacrificial layer isolation opening 109 can meet a profile requirement when the etching is performed downwards by using the shielding layer as a mask.

Figure 7:
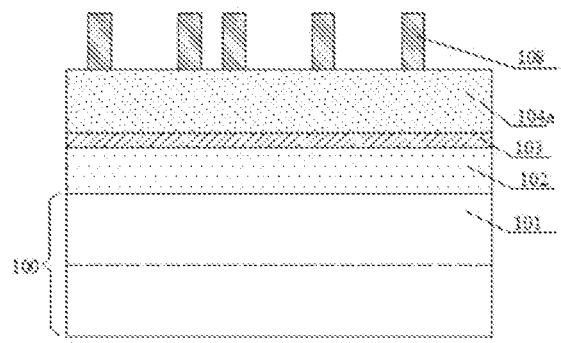
Figure 8:
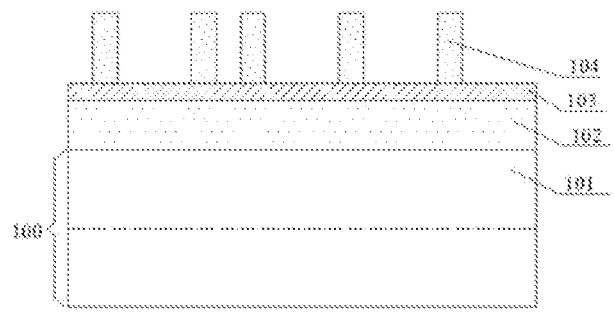

Then, referring to FIG. 7 and FIG. 8 in combination with FIG. 6, FIG. 7 and FIG. 8 as well as FIG. 6 are based on the same angle of view. After the patterning the sacrificial layer 108, the method further includes: removing the pattern memory layer 105; and etching the mandrel material layer 104a by using the sacrificial layer 108 as a mask, to form the mandrel lines 104.

Certainly, after the patterning the sacrificial layer 108, the step of forming the mandrel lines 104 includes: etching the mandrel material layer 104a using the sacrificial layer 108 on which the sacrificial layer isolation opening 109 is formed as a mask, to form the mandrel lines 104 separated on the base.

The mandrel lines 104 are used for providing space to subsequently form a third trench.

In this form, the material of the mandrel lines 104 is polycrystalline silicon. In other forms, the material of the mandrel lines may alternatively be one or a combination of at least two of amorphous carbon, a photoresist, an organic dielectric layer material, or a dielectric anti-reflective coating material.

In some implementations of the method for forming a semiconductor structure according to the present disclosure, the trenches are first formed, and then the separated mandrel lines are formed at the positions corresponding to the first trench and the second trench; and the pattern of the photoresist used for forming the trenches is also a trench, and an area of a contact surface between the photoresist and the pattern memory layer is relatively large, which is different from directly forming the mandrel lines separated on the base, where the pattern of the photoresist is also a bulge having the same shape as the mandrel lines, and the area of the contact surface between the photoresist and the pattern memory layer is relatively small. Therefore, a problem that the photoresist peels off during etching due to an elongated shape when the mandrel lines separated on the base are formed through etching by directly using the photoresist as a mask in a process of forming a small-dimension pattern can be avoided. Further, the first trench and the second trench are formed successively using two photolithography processes using different masks, and the subsequently formed separated mandrel lines are formed using the same material, which can simplify steps of forming the mandrel lines for the first time using the first etching process and then performing material filling and performing the second photolithography process when the mandrel lines are formed directly using a plurality of photolithography processes, and lower a requirement on the filled material.

One will appreciate that as a width of a pattern line of a metal connection line becomes increasingly small, a dimension of a pattern gets increasingly close to a limit of a device parameter. Two masks are not enough to form a pattern of a required dimension, and a third mask needs to be added. However, a plurality of masks inevitably leads to a problem of an overlay shift, which undoubtedly poses a higher requirement on overlay precision. Therefore, how to process a smaller-dimension pattern in a BEOL processing process with the dimension of the pattern close to the limit of the device parameter also becomes a problem currently faced directly by a person skilled in the art. In forms of the present disclosure, the mandrel lines separated on the base are finally formed based on the foregoing two masks, and then a series of subsequent steps are performed on the mandrel lines, thereby ensuring that "self-overlay" can be implemented using an anti-etching layer when the third photolithography process is performed, to improve the overlay precision in the photolithography process. A smaller-dimension pattern can still be processed in the BEOL processing process even though the dimension of the pattern is close to the limit of the device parameter, thereby ensuring processing quality while reducing production costs.

Figure 11:
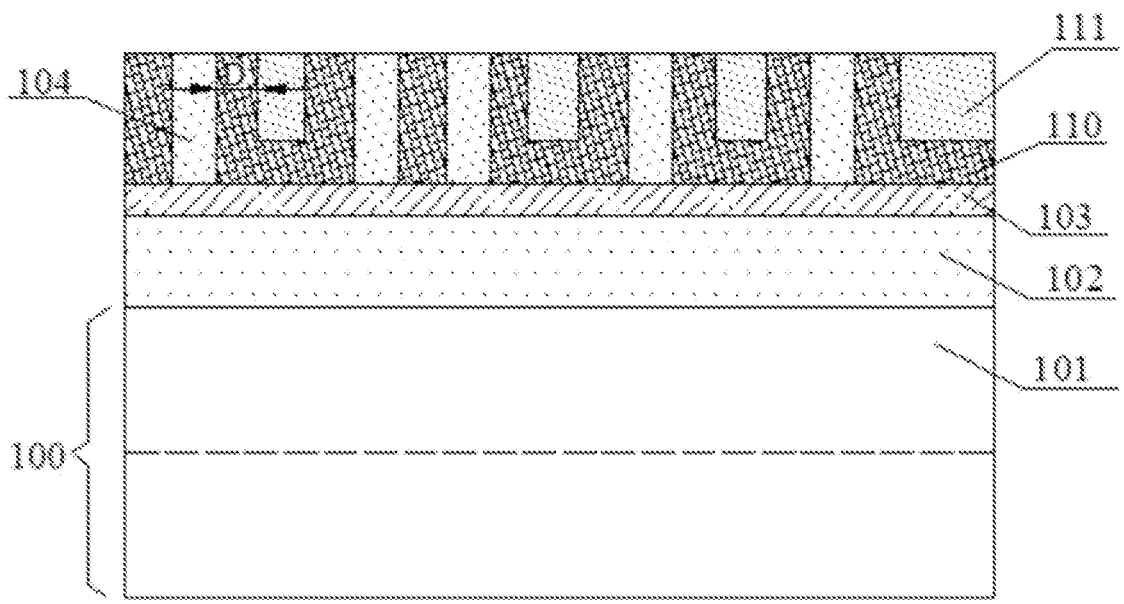

Specifically, referring to FIG. 9 to FIG. 15, after the forming mandrel lines separated on the base, the method further includes:

as shown in FIG. 11, forming an anti-etching layer 110 and a dielectric layer 111, where the anti-etching layer 110 conformally covers sidewalls of the mandrel lines 104 and the base 100 between the mandrel lines 104, the dielectric layer 111 covers the anti-etching layer 110 above the base between the mandrel lines 104, and a top surface of the dielectric layer 111 is flush with top surfaces of the mandrel lines 104; and patterning the anti-etching layer 110, the dielectric layer 111, and the film layer on which the mandrel lines 104 are located, to form a third trench 112 (shown in FIG. 16), where the third trench 112 corresponds to the metal interconnect layer.

It should be noted that the third trench corresponding to the metal interconnect layer means that subsequently, the metal interconnect layer that needs electrical connection in the base may be exposed when the base is etched downwards using sidewalls around the third trench as a mask. Subsequently, when the etching is performed downwards using the dielectric layer around the third trench as a mask, a trench having the same profile as the third trench may be formed on the base. Because the third trench corresponds to the metal interconnect layer in the base, that is, the trench formed on the base can expose the metal interconnect layer, subsequently, a metal layer formed in the trench of the base can be in contact with the metal interconnect layer, and after energization, the metal layer is electrically connected to the metal interconnect layer.

Figure 9:
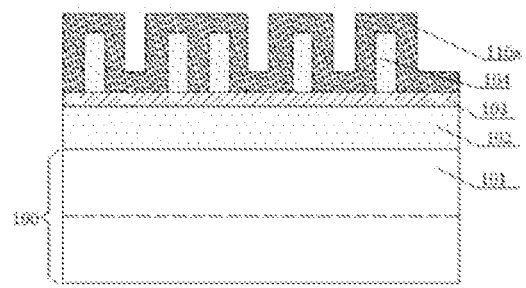
Figure 10:
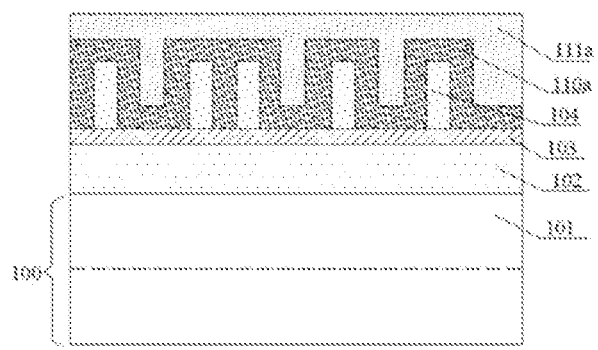

Specifically, referring to FIG. 9 and FIG. 10, the step of forming an anti-etching layer 110 and a dielectric layer 111 includes:

forming an anti-etching material layer 110a, where the anti-etching material layer 110a conformally covers tops and sidewalls of the mandrel lines 104 and conformally covers the base 100 between the mandrel lines 104; forming the dielectric material layer 111a, where the dielectric material layer 111a covers the anti-etching material layer 110a, and a top surface of the dielectric material layer 111a is a plane; and flattening the dielectric material layer 111a and the anti-etching material layer 110a by using the mandrel lines 104 as etch stop layers.

Specifically, the step of patterning the anti-etching layer, the dielectric layer, and the mandrel lines, to form a third trench includes: forming a patterned photoresist on the dielectric layer, the anti-etching layer, and the mandrel lines; etching the dielectric layer and the anti-etching layer below the dielectric layer by using the photoresist as a mask, to form an etched trench; and removing the mandrel line to form a mandrel trench and form the third trench including the etched trench and the mandrel trench.

In this form, to simplify a process, in the step of forming a third trench, the etched trench is first formed using the third photolithography process, and then the mandrel line is removed to form the mandrel trench. Certainly, in other forms, alternatively, a mandrel line may be removed first to form a mandrel trench, an anti-reflective coating is then used to fill the mandrel trench at the position of the mandrel line, and then a photoresist is formed on the anti-reflective coating to perform the third photolithography process. The anti-reflective coating in the etched trench is finally removed to form an etched trench. The etched trench and the mandrel trench form the third trench.

In this form, an etch selectivity of the dielectric layer 111 to the anti-etching layer 110 is greater than 10:1. Therefore, subsequently, when the third photolithography process is performed on the anti-etching layer 110, the dielectric layer 111, and the film layer on which the mandrel lines 104 are located to form the etched trench, the anti-etching layer 110 can achieve a self-overlay effect. Even if there is an overlay shift in the photolithography process, because the dielectric layer 111 and the anti-etching layer 110 have different etch rates, the formed etched trench is completely formed by etching the dielectric layer 111, thereby improving the formation quality of the etched trench.

In this form, a process of forming the anti-etching layer is the ALD process. By using the ALD process, the uniformity and step coverage of the anti-etching layer are better, and a thickness of the anti-etching layer is easy to control. Certainly, in another embodiment, the anti-etching layer may alternatively be formed by using other processes such as a chemical vapor deposition (CVD) process or a physical vapor deposition process.

It should be noted that the thickness of the anti-etching layer refers to a dimension in a direction perpendicular to an extending direction of the mandrel lines, for example, a dimension D shown in FIG. 11.

It is easy to understand that the dimension (the dimension D in FIG. 11) of the anti-etching layer in the direction perpendicular to the extending direction of the mandrel lines cannot be excessively large or excessively small. If the dimension D is excessively large, a dielectric layer between two adjacent mandrel lines in the direction perpendicular to the extending direction of the mandrel lines may be caused to have an excessively small dimension or even the dielectric layer cannot be formed. As a result, when the third photolithography process is performed to form the etched trench, the etched trench at the position may be caused to have an excessively small dimension, or even a pattern of the etched trench is caused to disappear. If the dimension D is excessively small, a dielectric layer between two adjacent mandrel lines in the direction perpendicular to the extending direction of the mandrel lines may be caused to have an excessively large dimension. As a result, when the third photolithography process is performed subsequently, the anti-etching layer cannot achieve a self-overlay effect, which may cause the formed etched trench to have a relatively large dimension in the direction perpendicular to the extending direction of the mandrel lines. Therefore, in this form, the dimension of the anti-etching layer in the direction perpendicular to the extending direction of the mandrel lines ranges from 6 nm to 20 nm.

To ensure that a dimension of a pattern of an etched trench meets a process requirement, similar to the first trench and the second trench in the foregoing two photolithography processes, the etched trench also needs to be cut.

It should be noted that in forms of the method for forming a semiconductor structure according to the present disclosure, the trench cutting is performed for a pattern that has an excessively small pattern dimension and whose trench cannot be formed with one exposure. In another form, if a pattern can be directly exposed to form a trench meeting a dimension requirement, the step of cutting a trench does not need to be performed.

In forms of the present disclosure, there are two methods for forming an etched trench using the third photolithography process. A complete trench may be formed first by using the third photolithography process, and then the trench is cut. Alternatively, a region in which no etched trench needs to be formed may be shielded first, and then an etched trench is formed using the third photolithography process. The step of forming a complete trench first using the third photolithography process, and then cutting the trench, to form an etched trench may include: etching the dielectric layer and the anti-etching layer below the dielectric layer, to form an initial etched trench; and filling a part of the initial etched trench, to form the etched trench, where the etched trench corresponds to the metal interconnect layer.

It is easy to understand that as described above, the metal interconnect layer in the base can be exposed subsequently when the base is etched downwards by using the sidewalls around the third trench as a mask; therefore, the etched trench also corresponds to the metal interconnect layer, that is, corresponds to a part of the metal interconnect layer, because the third trench includes the etched trench.

In this form, the manner of first shielding the region in which no etched trench needs to be formed, and then forming the etched trench using the third photolithography process is described. Specifically, referring to FIG. 12 to FIG. 14, after the forming an anti-etching layer and a dielectric layer, before the forming a third trench, the method further includes:

forming an isolation layer 116 (a black region marked using a circle in FIG. 12), where the isolation layer 116 is parallel to the mandrel lines 104, the isolation layer 116 is embedded in the dielectric layer 111, and a top surface of the isolation layer 116 is flush with the top surface of the dielectric layer 111.

After the forming an isolation layer 116, the step of patterning the anti-etching layer 110, the dielectric layer 111, and the mandrel lines 104, to form a third trench 112 includes:

forming a patterned photoresist 120 (shown in FIG. 13) on the dielectric layer 111, the anti-etching layer 110, the mandrel lines 104, and the isolation layer 116;

etching the dielectric layer 111, the anti-etching layer 110 below the dielectric layer 111, and dielectric layers 111 at two sides of the isolation layer 116 in a direction parallel to the extending direction of the mandrel lines by using the photoresist 120 as a mask, to form an etched trench 121 (shown in FIG. 14); and removing the mandrel line 104 to form a mandrel trench 122 (shown in FIG. 16) and form the third trench 112 including the etched trench 121 and the mandrel trench.

The step of forming an isolation layer 116 includes: forming a patterned mask layer (not shown in the figure), where the mask layer has an opening exposing a position corresponding to the isolation layer; removing a corresponding dielectric layer below a region of the opening by using the mask layer as a mask, to form a via running through the dielectric layer; and filling the via, to form the isolation layer.

The isolation layer 116 is used for replacing a part of the dielectric layer 111, to avoid etching a region (that is, the dielectric layer in the region before being replaced with the isolation layer) of the dielectric layer 111 that is not expected to be etched, thereby ensuring that a dimension of the etched trench formed by using the third photolithography process meets a process requirement.

Figure 12:
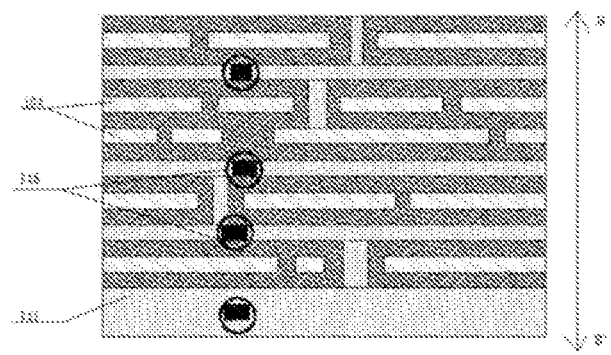
Figure 13:
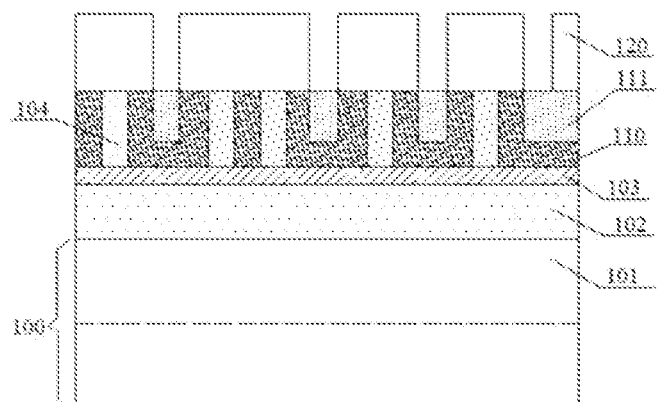

It should be noted that as shown in FIG. 12, the isolation layer being parallel to the mandrel lines means that the mandrel lines are spaced from the isolation layer in a direction of BB'. After the etched trench is formed subsequently, the three trenches formed using the three photolithography processes are parallel to each other. Because the etched trench is parallel to the mandrel lines, and the isolation layer is used for disconnecting adjacent etched trenches, the isolation layer is certainly parallel to the mandrel lines.

A material of the isolation layer 116 is not limited, as long as it is ensured that the material of the isolation layer is different from the material of the dielectric layer.

Figure 14:
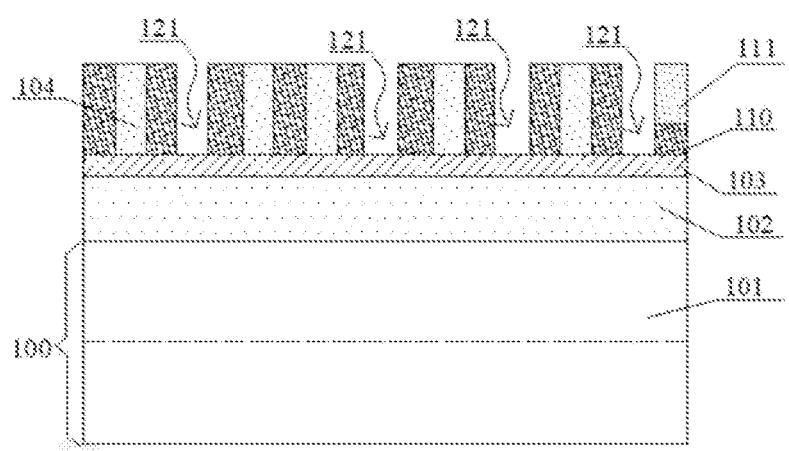
Figure 15:
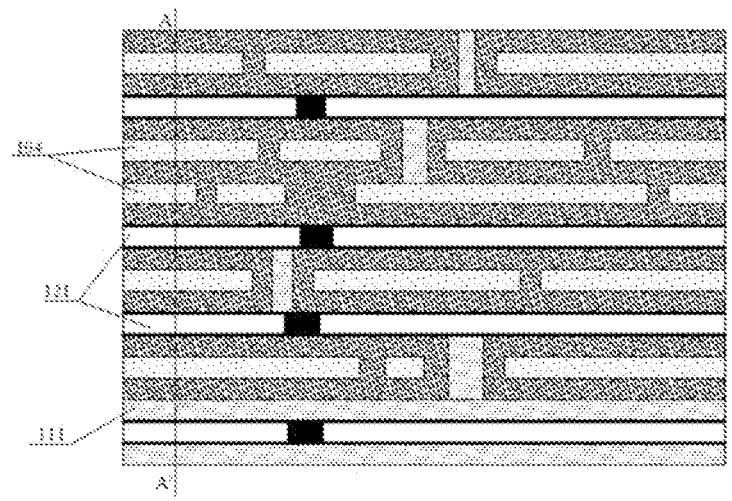

FIG. 15 is top view. FIG. 14 is a cross-sectional view along a direction of a line AA' in FIG. 15.

As shown in FIG. 15, the etched trench 121 is formed by using the third photolithography process.

Figure 16:
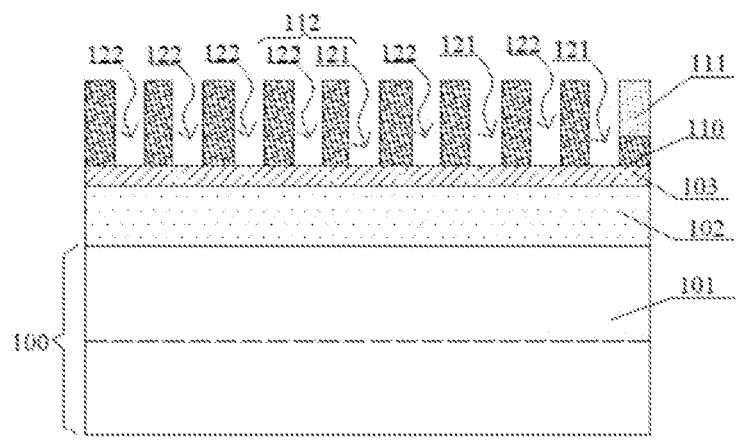

Referring to FIG. 16 in combination with FIG. 14, FIG. 16 and FIG. 14 are cross-sectional views based on the same angle of view. As shown in FIG. 16, the step of forming a mandrel trench 122 includes: removing the mandrel line 104, to form the mandrel trench 122. After the etched trench 121 and the mandrel trench 122 are both formed, the etched trench 121 and the mandrel trench 122 form the third trench 112.

The process for removing the mandrel line may be a dry etching process, or may be a wet etching process, as long as it is ensured that the mandrel line can be completely removed.

After the forming a third trench 112, the method further includes:

etching the dielectric layer using sidewalls of the third trench as a mask, that is, etching the dielectric layer exposed from the third trench, to form a fourth trench, where the fourth trench exposes the metal interconnect layer. The fourth trench is used for forming a metal layer.

Certainly, to improve the accuracy of transferring a pattern to the base and avoid that the precision of the pattern is reduced due to premature mask consumption when the sidewalls (the anti-etching layer and the dielectric layer) around the third trench are used as a mask, forms of the method for forming a semiconductor structure according to the present disclosure, before the forming a pattern memory layer 105, further includes: forming a mask layer 102 (shown in FIG. 16) on the base; and forming the pattern memory layer on the mask layer when the mask layer 102 exists.

In a subsequent step of a process, the mask layer 102 is used for protecting a top surface of the dielectric layer 101.

In a subsequent process of forming the fourth trench, the patterned mask layer 102 is further used as an etching mask to etch the fourth trench.

Figure 17:
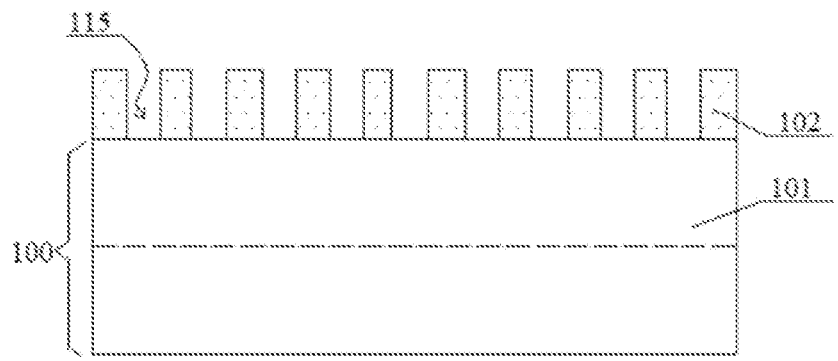
Figure 18:
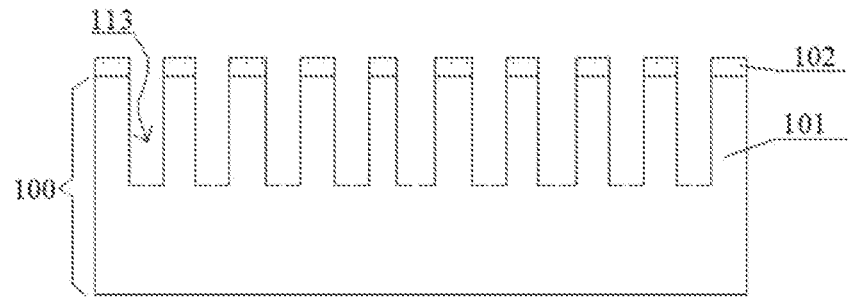
Figure 19:
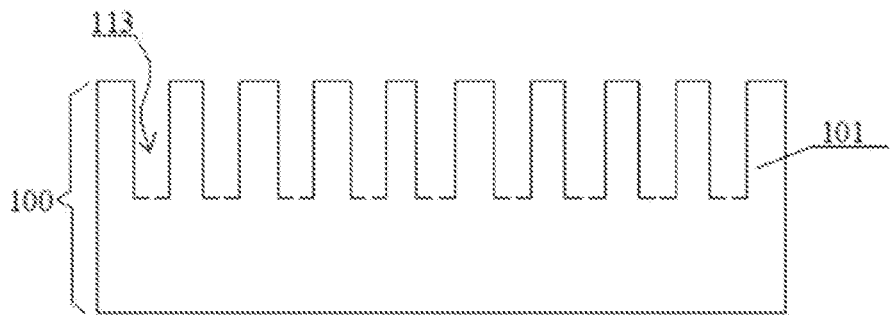

Referring to FIG. 17 to FIG. 19 in combination with FIG. 16, the step of forming a fourth trench 113 includes:

etching the mask layer 102 and the dielectric layer 101 using the sidewalls of the third trench 112 as a mask, to form the fourth trench 113.

Specifically, the mask layer 102 exposed from the third trench 112 is etched by using the anti-etching layer 110 and the dielectric layer 111 as a mask, to form a fifth trench 115.

The dielectric layer 101 of the base 100 exposed from the fifth trench 115 is etched using the mask layer 102 as a mask, to form the fourth trench 113.

In this form, in the step of forming a fourth trench 113, the anti-etching layer 110 and the dielectric layer 111 are both consumed, and the mask layer 102 may remain. In another form, after the fourth trench is formed, the mask layer may also be consumed.

As shown in FIG. 18 and FIG. 19, after the fourth trench 113 is formed, if the mask layer 102 exists, the method further includes: removing the remaining mask layer 102.

In this form, a material of the mask layer 102 is titanium nitride. In other forms, the material of the mask layer may be one or a combination of at least two of tantalum nitride, titanium oxide, tantalum oxide, or a tungsten carbide composite.

It is easy to understand that when the mandrel lines are located at positions that are on a film layer below the first trench and the second trench and correspond to the first trench and the second trench, that is, when the semiconductor structure includes a sacrificial layer and a mandrel material layer, to improve firmness of the mandrel material layer formed on the mask layer, after the mask layer is formed, before the pattern memory layer is formed, the method further includes: forming an adhesive layer 103 (shown in FIG. 16) on the base, where the adhesive layer 103 covers the mask layer 102. When the adhesive layer exists, the mandrel material layer is formed on the adhesive layer.

In this form, a material of the adhesive layer 103 is aluminum oxide. In other forms, the material of the adhesive layer may alternatively be silicon oxide.

When the adhesive layer exists, the mask layer 102 exposed from the third trench is etched using the anti-etching layer and the dielectric layer as a mask, to form the fourth trench, and the adhesive layer above the mask layer is also etched at the same time.

Figure 20:
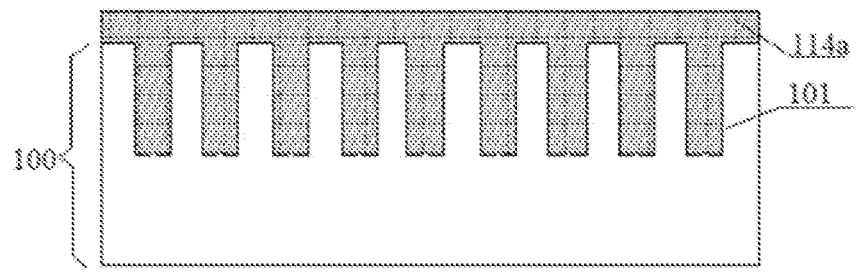
Figure 21:
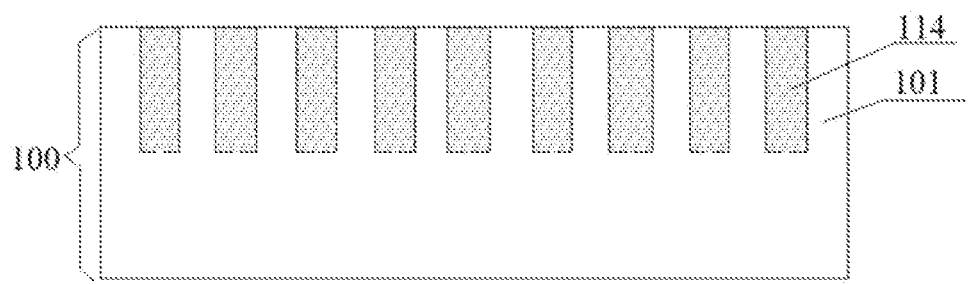

As shown in FIG. 20 and FIG. 21, after forming a fourth trench 113 (shown in FIG. 19), the method further includes: forming a metal layer 114, where the metal layer 114 fills the fourth trench, a top surface of the metal layer 114 is flush with the top surface of the dielectric layer 101, and the metal layer is electrically connected to the metal interconnect layer.

The metal layer is used for electrically connecting to the metal interconnect layer in the base in a BEOL process, to electrically connect a semiconductor device (for example, a transistor) or a functional structure to an external circuit or another interconnect structure.

In this form, a material of the metal layer 114 is copper. In other forms, the material of the metal layer may alternatively be one or a combination of at least two of tungsten, cobalt, or aluminum.

Specifically, the step of forming a metal layer 114 includes:

forming a metal material layer 114a, where the metal material layer 114a fills the fourth trench and covers the base; and flattening the metal material layer 114a, to form the metal layer 114, where a top surface of the metal layer 114 is flush with the top surface of the dielectric layer 101.

When the metal material layer 114a is flattened, the dielectric layer 101 is used as an etch stop layer.

Referring to FIG. 11, The present disclosure further provides forms of a semiconductor structure. In one form, a semiconductor structure includes:

a base 100, including a metal interconnect layer;

mandrel lines 104, separated on the base 100, where the mandrel lines 104 are formed using two photolithography processes, a photoresist used in the two photolithography processes is negative, and the mandrel lines 104 correspond to the metal interconnect layer;

an anti-etching layer 110, conformally covering sidewalls of the mandrel lines 104, and conformally covering the base 100 between the mandrel lines 104; and a dielectric layer 111, covering the anti-etching layer 110 above the base 100 between the mandrel lines 104, where a top surface of the dielectric layer 111 is flush with top surfaces of the mandrel lines 104.

The base 100 is used for providing a process platform for a manufacturing process. A semiconductor device such as a transistor or a capacitor may be formed in the base 100. A functional structure such as a resistance structure or a conductive structure may also be formed in the base.

The base 100 includes the metal interconnect layer (not shown in the figure). After a metal layer is subsequently formed on the base 100, the metal interconnect layer is used for electrically connecting to the metal layer in a BEOL process, to electrically connect the semiconductor device (for example, the transistor) or the functional structure to an external circuit or another interconnect structure.

The base further includes a dielectric layer 101. The dielectric layer 101 covers the metal interconnect layer.

The dielectric layer 101 is used for electrically isolating adjacent interconnect lines of the metal layer in the BEOL process.

That the mandrel lines 104 are formed using two photolithography processes, and a photoresist used in the two photolithography processes is negative means that the mandrel lines are not separated mandrel lines directly formed through etching using a photoresist, but are formed in a manner of first etching a pattern memory layer using a photoresist to form trenches, then filling the trenches with a material, and finally removing the pattern memory layer.

It can be seen that the mandrel lines 104 need to be formed using a material that can be easily removed. The material of the mandrel lines 104 may be one or a combination of at least two of polycrystalline silicon, amorphous carbon, a photoresist, an organic dielectric layer material, or a dielectric anti-reflective coating material.

The separated mandrel lines are formed through trenches, so that a problem that the photoresist peels off during etching due to an elongated shape when the separated mandrel lines are directly formed can be avoided. Further, a problem of a relatively high requirement on a filling material when the mandrel lines are formed directly using a plurality of photolithography processes (for example, the mandrel lines are formed for the first time by using the first etching process, and then material filling is performed and the second photolithography process is performed) can also be avoided.

In this form, an etch selectivity of the dielectric layer 111 to the anti-etching layer 110 is greater than 10.

Therefore, subsequently, when the third photolithography process is performed on the anti-etching layer 110, the dielectric layer 111, and a film layer on which the mandrel lines 104 are located, the anti-etching layer 110 can achieve a self-overlay effect. Even if there is an overlay shift in the photolithography process, because the dielectric layer 111 and the anti-etching layer 110 have different etch rates, a formed pattern is completely formed by etching the dielectric layer 111, thereby improving the formation quality of the pattern. Subsequently, the "self-overlay" can be implemented using the anti-etching layer when the third photolithography process is performed, to improve the overlay precision in the photolithography process. A smaller-dimension pattern can still be processed in the BEOL processing process even though a dimension of a pattern is close to a limit of a device parameter, thereby ensuring processing quality while reducing production costs.

The semiconductor structure may be formed using the forming method described in the foregoing forms, or may be formed using other forming methods. For detailed descriptions of the semiconductor structure in this form, reference may be made to corresponding descriptions in the foregoing forms as details are not described again.

Although the present disclosure is described above, the present disclosure is not limited thereto. A person skilled in the art can make various changes and modifications without departing from the spirit and the scope of the present disclosure. Therefore, the protection scope of the present disclosure should be subject to the scope defined by the claims.

What is claimed is:

1. A method for forming a semiconductor structure, comprising:

providing a base;

forming a pattern memory layer on the base, wherein at least a first trench and a second trench are provided on the pattern memory layer, an extending direction of the first trench is parallel to an extending direction of the second trench, and the first trench and the second trench are formed using different masks, a material of the pattern memory layer is silicon oxide and is not silicon nitride; and forming mandrel lines separated on the base at positions of the base that correspond to the first trench and the second trench, a material of the mandrel lines consists of at least one of amorphous carbon, a photoresist, or polycrystalline silicon.

2. The method for forming a semiconductor structure according to claim 1, wherein:
   before forming a pattern memory layer on the base, the method further comprises: forming a mandrel material layer on the base; and
   the step of forming mandrel lines separated on the base comprises:
      forming a sacrificial layer filling the first trench and the second trench;
      removing the pattern memory layer; and
      etching the mandrel material layer using the sacrificial layer as a mask, to form the mandrel lines separated on the base.

3. The method for forming a semiconductor structure according to claim 2, wherein:
   after the forming a sacrificial layer, before the removing the pattern memory layer, the method further comprises:
      etching the sacrificial layer, to form a sacrificial layer isolation opening; and
   the step of etching the mandrel material layer using the sacrificial layer as a mask, to form the mandrel lines separated on the base comprises:
      etching the mandrel material layer using the sacrificial layer on which the sacrificial layer isolation opening is formed as a mask, to form the mandrel lines separated on the base.

4. The method for forming a semiconductor structure according to claim 2, wherein a material of the sacrificial layer is silicon nitride.

\* \* \* \* \*